United States Patent
Kojima et al.

(10) Patent No.: US 8,174,027 B2
(45) Date of Patent: May 8, 2012

(54) SEMICONDUCTOR LIGHT EMITTING DEVICE AND METHOD FOR MANUFACTURING SAME

(75) Inventors: Akihiro Kojima, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/575,778

(22) Filed: Oct. 8, 2009

(65) Prior Publication Data
US 2010/0237368 A1 Sep. 23, 2010

(30) Foreign Application Priority Data

Mar. 18, 2009 (JP) .................................. 2009-065646

(51) Int. Cl.
*H01L 27/15* (2006.01)
*H01L 29/26* (2006.01)
*H01L 31/12* (2006.01)
*H01L 33/00* (2010.01)
*H01L 23/04* (2006.01)

(52) U.S. Cl. ............. 257/79; 257/81; 257/99; 257/698; 257/707; 257/774; 257/E21.117; 257/E21.499

(58) Field of Classification Search ........... 257/E21.117, 257/E21.499
See application file for complete search history.

(56) References Cited

U.S. PATENT DOCUMENTS

| | | | |
|---|---|---|---|
| 6,531,328 B1 | 3/2003 | Chen | |
| 6,835,960 B2 * | 12/2004 | Lin et al. | 257/81 |
| 7,538,357 B2 * | 5/2009 | Onishi et al. | 257/93 |
| 7,787,512 B2 * | 8/2010 | Koda et al. | 372/50.124 |
| 7,851,817 B2 * | 12/2010 | Yasuda et al. | 257/98 |
| 2007/0170454 A1 | 7/2007 | Andrews | |
| 2008/0290820 A1 * | 11/2008 | Kim et al. | 315/306 |
| 2009/0101923 A1 * | 4/2009 | Choi et al. | 257/89 |
| 2009/0179211 A1 * | 7/2009 | Yoo et al. | 257/98 |
| 2009/0188709 A1 | 7/2009 | Kojima et al. | |
| 2009/0267108 A1 * | 10/2009 | Lin et al. | 257/99 |
| 2009/0273004 A1 * | 11/2009 | Lin et al. | 257/99 |
| 2009/0289272 A1 * | 11/2009 | Kim et al. | 257/98 |

FOREIGN PATENT DOCUMENTS

CN 101005110 A 7/2007

(Continued)

OTHER PUBLICATIONS

Y. Shimooka et al., "Robust Hermetic Wafer Level Thin-Film Encapsulation Technology for Stacked MEMS/IC Package", 2008 Electronics Components and Technology Conference, pp. 824-828.
Mamoru Miyachi et al., "GaN-based laser diodes transferred onto a GaAs substrate", Pioneer R&D vol. 12, No. 3, 2002, 3 pages.

(Continued)

*Primary Examiner* — Mohsen Ahmadi
(74) *Attorney, Agent, or Firm* — Oblon, Spivak, McClelland, Maier & Neustadt, L.L.P.

(57) ABSTRACT

A semiconductor light emitting device, includes: a substrate including a first major surface and a second major surface, the first major surface including a recess and a protrusion, the second major surface being formed on a side opposite to the first major surface; a first electrode provided on the first major surface; a semiconductor light emitting element provided on the first electrode and electrically connected to the first electrode; a second electrode provided on the second major surface; and a through-electrode provided to pass through the substrate at the recess and electrically connect the first electrode and the second electrode.

7 Claims, 6 Drawing Sheets

FOREIGN PATENT DOCUMENTS

| | | |
|---|---|---|
| JP | 2004-284831 | 10/2004 |
| JP | 2006-339060 | 12/2006 |
| JP | 2007-243054 | 9/2007 |
| JP | 2008-112867 | 5/2008 |

OTHER PUBLICATIONS

Chinese Office Action with English translation issued Feb. 14, 2012, in Chinese Patent Application No. 201010135750.1, 10 pages.

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2009-065646, filed on Mar. 18, 2009; the entire contents of which are incorporated herein by reference.

BACKGROUND

Although semiconductor light emitting devices for illumination require monochromatic light emission in some cases, basically, white light near sunlight is needed. White semiconductor light sources include primary color (RGB) device arrays, pseudo-white light sources using a color mixture from a blue light emitting device and yellow light produced by self-excited light emission at substrate defects of the blue light emitting device, primary color fluorescent material excitation light sources using ultraviolet light emitting devices, and the like (for example, JP-A 2007-243054 (Kokai), JP-A 2008-112867 (Kokai), and JP-A 2006-339060 (Kokai)).

For such semiconductor light emitting devices, technology is known for removing a light emitting device substrate used during crystal growth such as JP-A 2004-284831 (Kokai), Pioneer R&D, 2000, Vol. 12, No. 3, p. 77, and the like. Known technology for sealing functioning devices in the wafer form includes Electronic Components & Technology Conference, 2008, p. 824 and the like.

In the case where semiconductor light emitting devices are utilized as illumination to replace incandescent lightbulbs and fluorescent lamps, a relatively high light output is necessary. Therefore, insufficient heat dissipation of the semiconductor light emitting device easily causes the undesirable deterioration of the sealing resin protecting the semiconductor light emitting device.

The life of a semiconductor light emitting device itself is much longer than that of an incandescent lightbulb. The main causes of the semiconductor light emitting device becoming unusable may include oxidization, deterioration, and overheating of the metal of the electrode portions, shorts of gold wire in the interior due to shocks, etc. Product life refers to the point when the ability to transmit light drops due to deterioration of the sealing resin and the amount of light emission falls below a constant level. In particular, the resin in components using fluorescent material excitation by a light emitting device emitting blue to ultraviolet light easily deteriorates due to the heat from the exciting device and the ultraviolet rays; and it is difficult to realize high output and long life.

In package structures in which a light emitting device chip is mounted on a substrate of silicon and the like, thinner substrates are desirable due to the need for good heat dissipation, flexibility, etc. However, limitations are encountered when making the entire surface of the substrate thinner from the aspects of ease of handling, reliability, and the like.

SUMMARY

According to an aspect of the invention, there is provided a semiconductor light emitting device, including: a substrate including a first major surface and a second major surface, the first major surface including a recess and a protrusion, the second major surface being formed on a side opposite to the first major surface; a first electrode provided on the first major surface; a semiconductor light emitting element provided on the first electrode and electrically connected to the first electrode; a second electrode provided on the second major surface; and a through-electrode provided to pass through the substrate at the recess and electrically connect the first electrode and the second electrode.

According to another aspect of the invention, there is provided a method for manufacturing a semiconductor light emitting device, including: forming a first electrode on a first major surface of a substrate including the first major surface and a second major surface, the first major surface including a recess and a protrusion, the second major surface being formed on a side opposite to the first major surface; making a connection hole in the substrate at the recess to communicate between the first major surface and the second major surface; forming a second electrode in the connection hole and on the second major surface; electrically connecting the first electrode and the second electrode; and mounting a semiconductor light emitting element on the first electrode.

According to still another aspect of the invention, there is provided a method for manufacturing a semiconductor light emitting device, including: forming a first electrode on a first major surface of a substrate; making a connection hole in the substrate to communicate from the first major surface to a second major surface, the second major surface being on a side opposite to the first major surface; forming a second electrode in the connection hole and on the second major surface; electrically connecting the first electrode and the second electrode; mounting a semiconductor light emitting element on the first electrode; forming a sacrificial layer to cover the semiconductor light emitting element; forming a reinforcing film on the sacrificial layer; removing the sacrificial layer via an opening made in the reinforcing film to make a gap between the semiconductor light emitting element and the reinforcing film; forming a fluorescent material on the reinforcing film; and performing heat treatment to reform the fluorescent material.

DETAILED DESCRIPTION OF THE INVENTION

Embodiments of the invention will now be described with reference to the drawings. Although several specific configurations are described as examples herein, the invention is not limited to the embodiments described hereinbelow; and the invention is similarly practicable using configurations having similar functions.

Figure 1:
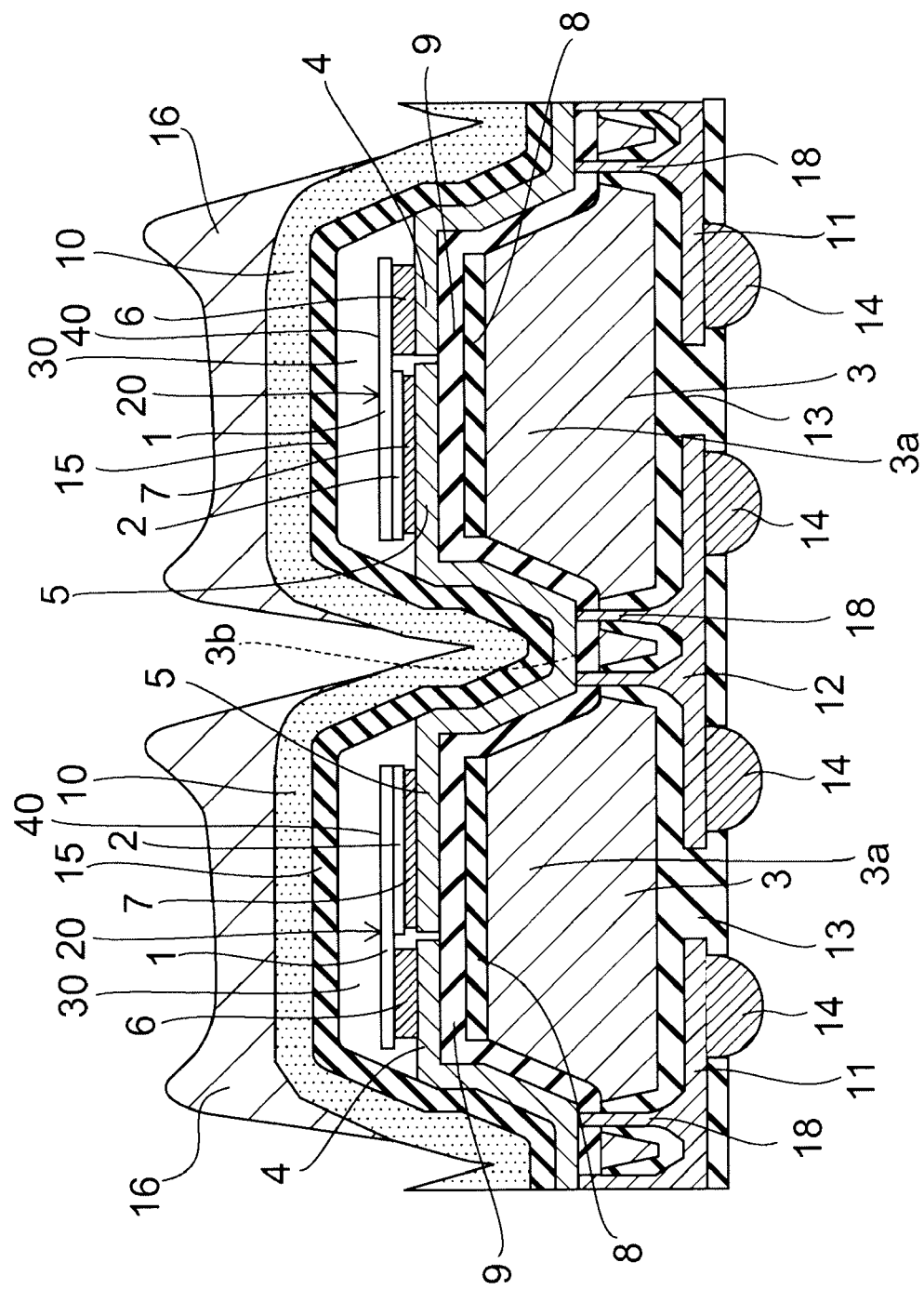
FIG. 1 is a schematic cross-sectional view of a semiconductor light emitting device according to an embodiment.
Figure 2:
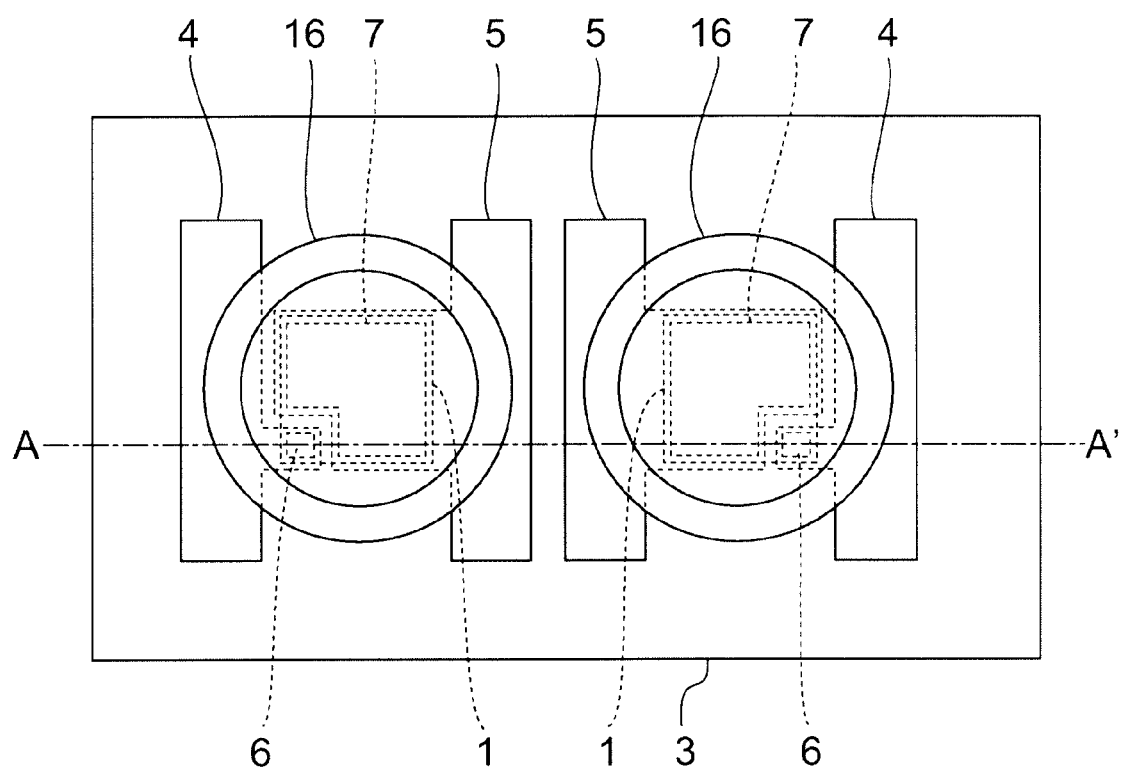
FIG. 2 is a schematic view showing a planar layout of the main components of the semiconductor light emitting device.

FIG. 1 is a schematic cross-sectional view of a semiconductor light emitting device according to an embodiment. FIG. 2 illustrates a planar layout example of the main components illustrated in FIG. 1. FIG. 1 corresponds to a cross section along line A-A' of FIG. 2.

The semiconductor light emitting device according to this embodiment has a structure in which a semiconductor light emitting element 20 having a chip configuration is mounted on a substrate 3.

The substrate 3 is thermally conductive and is, for example, a silicon substrate. Sapphire, SiC, and the like also may be used as the substrate 3. A silicon substrate is comparatively inexpensive and is very easy to process.

The substrate 3 has a first major surface and a second major surface formed on the side opposite to the first major surface. As described below, the first major surface is selectively etched using a mask (e.g., a silicon oxide film) 8 to form recesses and protrusions.

The semiconductor light emitting element 20 includes an n-type semiconductor 1 and a p-type semiconductor 2. The pn junction between the n-type semiconductor 1 and the p-type semiconductor 2 forms a light emitting portion. One example includes using a semiconductor having a relatively large band gap (e.g., GaN) between the n-type semiconductor 1 and the p-type semiconductor 2 in a structure in which a semiconductor having a relatively small band gap (e.g., InGaN) is interposed between the n-type semiconductor 1 and the p-type semiconductor 2 as an activation layer. Injected carriers (minority carriers) are effectively confined to the activation layer, and a high luminous efficacy is obtained by the effective light emission when the minority carriers recombine. The semiconductor light emitting element 20 is not limited to a light emitting diode and may include an LD (Laser Diode).

A dielectric film 9 covers the first major surface of the substrate 3 in which recesses and protrusions are formed. The semiconductor light emitting element 20 and the substrate 3 are thereby electrically insulated. An n-side interconnect electrode 4 and a p-side interconnect electrode 5 are formed on the dielectric film 9 to form first electrodes. The n-side interconnect electrode 4 and the p-side interconnect electrode 5 are provided separately and insulatively separated from each other on a protrusion 3a.

The semiconductor light emitting element 20 is mounted on the n-side interconnect electrode 4 and the p-side interconnect electrode 5 via an n-side bonding metal 6 and a p-side bonding metal 7. In the semiconductor light emitting element 20, the n-type semiconductor 1 is electrically connected to the n-side interconnect electrode 4 via the n-side bonding metal 6; and the p-type semiconductor 2 is electrically connected to the p-side interconnect electrode 5 via the p-side bonding metal 7. The semiconductor light emitting element 20 is mounted on the protrusion 3a of the first major surface of the substrate 3.

The n-side bonding metal 6 and the p-side bonding metal 7 are made of, for example, a conductive material such as solder, silver paste, gold bumps, etc., and bond the semiconductor light emitting element 20 having a chip configuration to the n-side bonding metal 6 and the p-side bonding metal 7 by thermal fusion, thermal curing, ultrasonic bonding, and the like.

A reinforcing film 15 is provided on the n-side interconnect electrode 4 and the p-side interconnect electrode 5. The reinforcing film 15 is provided also above the semiconductor light emitting element 20 in a dome configuration via a gap 30. A fluorescent material 10 is provided on the reinforcing film 15. The light extraction surface of the semiconductor light emitting element 20 opposes the fluorescent material 10 via the gap 30 and the reinforcing film 15.

The fluorescent material 10 is excited by light emitted by the semiconductor light emitting device 20 and emits light having a different wavelength than the semiconductor light emitting element 20. Examples of the fluorescent material 10 include, for example, $Y_2O_2S$:Eu, $YVO_4$:Eu, and the like for red; ZnS:(Cu, Al), (Ba, Mg) $Al_{10}O_{17}$:(Eu, Mn), and the like for green; and (Ba, Mn) $Al_{10}O_{17}$:Eu, (Sr, Ca, Ba, Mg)$_{10}$ $(PO_4)_6C_{12}$:Eu, and the like for blue.

The reinforcing film 15 has the functions of stabilizing and maintaining the fluorescent material 10 above the gap 30 and sealing the gap 30. The reinforcing film 15 is dielectric to prevent shorts to the n-side interconnect electrode 4 and the p-side interconnect electrode 5. The reinforcing film 15 is transparent with respect to the light emission wavelength of the semiconductor light emitting element 20 and has the ability to transmit the light emitted by the semiconductor light emitting element 20. A silicon oxide film, for example, may be used as the reinforcing film 15 to realize such functions.

A lens 16 is provided on the fluorescent material 10 and has functions of diffusing and spreading the light emitted by the semiconductor light emitting element 20 and the fluorescent material 10. The lens 16 may be formed by, for example, coating a resin onto the fluorescent material 10 and subsequently imprinting the resin into a concave configuration using a template.

Although the light for exciting the fluorescent material 10 in this embodiment is extracted from the top face of mainly the n-type semiconductor 1, semiconductor materials generally have high refractive indices, and much reflection occurs at the interface with air (or a vacuum). For example, in the case of a GaN n-type semiconductor 1 with a light emission wavelength of 380 nm, about 20% of the light is undesirably reflected when being output from the n-type semiconductor 1.

Therefore, it is desirable to increase the efficiency by forming an anti-reflection coating (hereinbelow referred to as "AR coating") 40 on the top face (the light extraction surface) of the semiconductor light emitting element 20 prior to or after mounting the semiconductor light emitting element 20. In such a case, providing a nitride film and an oxide film having a refractive index of 1.6 and a thickness of 59 nm as the AR coating 40 can reduce the reflection when light is output from the n-type semiconductor 1 to 0.004% or less. By providing a 65 nm $SiO_2$ film, reflection suppression to about 0.9% is possible. Anti-reflection also is possible by providing fine recesses and protrusions smaller than the light emission wavelength on the light extraction surface of the n-type semiconductor 1.

An n-side bottom face bonding electrode 11 and a p-side bottom face bonding electrode 12 are provided as second electrodes on the second major surface of the substrate 3. The n-side bottom face bonding electrode 11 and the p-side bottom face bonding electrode 12 are insulated from the substrate 3 by a dielectric film (e.g., made of a resin material such as polyimide) 13 formed on the second major surface. The n-side bottom face bonding electrode 11 and the p-side bottom face bonding electrode 12 also are insulatively separated from each other by the dielectric film 13.

Through-holes are made in the substrate 3 from the bottom face of a recess 3b to the second major surface. A through-electrode 18 is provided in the interior of each of the through-holes. The through-electrode 18 passes through the dielectric film 9 formed below the n-side interconnect electrode 4 on the bottom face of the recess 3b to electrically connect the n-side interconnect electrode 4 and the n-side bottom face bonding electrode 11. Similarly, the through-electrode 18 passes through the dielectric film 9 formed below the p-side interconnect electrode 5 on the bottom face of the recess 3b to electrically connect the p-side interconnect electrode 5 and the p-side bottom face bonding electrode 12. The dielectric film 13 is provided also on the through-hole side walls to insulate the through-electrode 18 from the substrate 3.

External connection terminals 14 are provided on exposed portions of the n-side bottom face bonding electrode 11 and exposed portions of the p-side bottom face bonding electrode 12 on the second major surface side to connect to an external circuit. The external connection terminals 14 may include, for example, solder balls, metal bumps, and the like.

Planar illumination can be realized by mounting multiple chips (the semiconductor light emitting elements 20) on the substrate 3. An illumination source having a curved configuration can be realized to enable utilization in a wide range of applications by making the substrate 3 thin to provide flexibility. For example, utilization is possible as a backlight of a bendable liquid crystal display.

However, the substrate 3 is susceptible to reduced strength in the case where the entire surface of the substrate 3 is made uniformly thin to provide flexibility. Therefore, in this embodiment, a thickness reduction is performed while ensuring the strength by forming recesses and protrusions on the first major surface side of the substrate 3 while grinding the entire surface of the second major surface to make uniformly thin as described below.

The connection holes and the through-electrodes 18 are formed in the thin portions below the recesses 3b to provide draw-outs to the second major surface side from the n-side interconnect electrode 4 and the p-side interconnect electrode 5 provided on the first major surface side where the semiconductor light emitting element 20 is mounted. In other words, because the connection holes and the through-electrodes 18 are formed in the portions having a relatively small aspect ratio (ratio of depth to hole diameter), the processes are easier; the fillability of the through-electrodes 18 is better; unfilled portions of the through-electrodes 18 are prevented; and the reliability can be improved.

From the aspect of ensuring the strength, it is desirable that the surface area of the upper face of the protrusion 3a is larger than the bottom face of the recess 3b on the first major surface side of the substrate 3. The light emitting region of one substrate 3 can be increased and a higher output can be realized by mounting the semiconductor light emitting element 20 on the upper face of the protrusion 3a having the relatively large surface area.

Although higher outputs are necessary in the case where the semiconductor light emitting device is used for illumination, higher outputs are accompanied by increases of the amounts of light and heat emitted by the light emitting element. Because this embodiment has a structure in which the fluorescent material 10 does not directly cover the semiconductor light emitting element 20 and the gap 30 exists between the semiconductor light emitting element 20 and the fluorescent material 10, the effects on the resin components of the fluorescent material 10 from the light and the heat from the semiconductor light emitting element 20 can be reduced, and the deterioration of the resin components can be suppressed. Also, the heat emitted by the semiconductor light emitting element 20 can be dissipated to the second major surface side via the substrate (e.g., silicon substrate) 3 having thermal conductivity. This dissipation also reduces the effects of heat on the fluorescent material 10. Thus, the semiconductor device according to this embodiment can realize a long life while providing a higher output.

In the case where the pressure of the atmosphere in the gap 30 is atmospheric pressure or more and, for example, the light emitted by the semiconductor light emitting element 20 is ultra-violet light, the light extraction efficiency to the fluorescent material 10 on the exterior of the gap 30 is susceptible to decrease due to reflection, diffusion, etc. Accordingly, it is desirable to provide a pressure in the gap 30 lower than atmospheric pressure. A lower pressure in the gap 30 also increases thermal insulation effects, and the effects of heat from the semiconductor light emitting element 20 on the fluorescent material 10 can be suppressed more effectively.

By providing the reinforcing film 15 between the gap 30 and the fluorescent material 10, the deterioration of the fluorescent material 10 can be suppressed compared to the case where the fluorescent material 10 directly defines the gap 30.

A method for manufacturing the semiconductor light emitting apparatus device to this embodiment will now be described with reference to FIG. 3A to FIG. 6C.

Figure 3A:
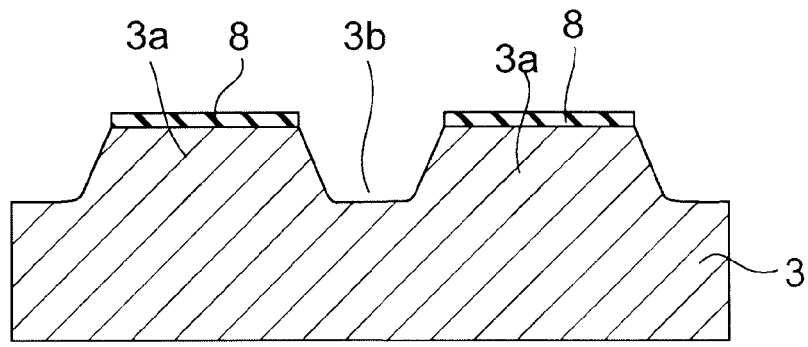
FIGS. 3A to 6C are schematic views showing a method for manufacturing the semiconductor light emitting device according to this embodiment.

First, the mask 8 is selectively formed on the first major surface of the substrate 3 as illustrated in FIG. 3A. Using the mask 8 as a mask, anisotropic etching is performed to form the recess 3b and the protrusion 3a. The mask 8 is formed by, for example, forming a silicon oxide film with a thickness of about 5 μm on the entire surface of the first major surface of the silicon substrate 3 by thermal oxidation and then performing patterning of the silicon oxide film using a resist.

After forming the mask 8, the recess 3b is made by anisotropic etching of the portions where the mask 8 is not formed using, for example, wet etching with KOH. The portions where the etching does not occur below the mask 8 form the protrusions 3a in cross-sectionally trapezoidal configurations. The difference in levels between the protrusion 3a and the recess 3b (the depth of the recess 3b) is, for example, about 100 μm. The etching selectivity for KOH of silicon to silicon oxide ($SiO_2$) is about 100:1. It may be necessary that the silicon oxide mask 8 has a thickness of at least 1 μm.

Figure 3B:
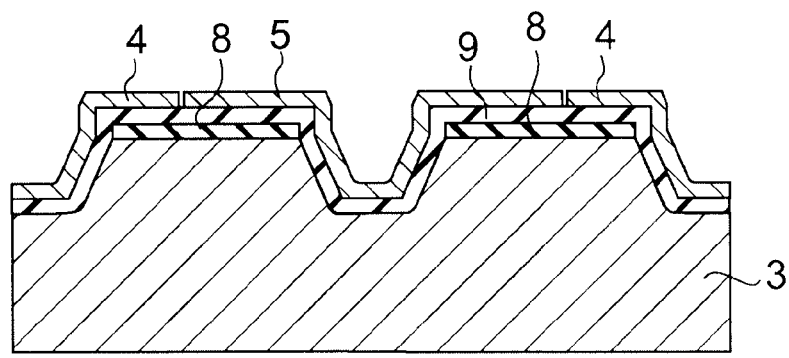

Then, as illustrated in FIG. 3B, the dielectric film 9 is formed to cover the first major surface. The n-side interconnect electrode 4 and the p-side interconnect electrode 5 are then formed on the dielectric film 9. The dielectric film 9 is, for example, a silicon oxide film formed by CVD (Chemical Vapor Deposition) with a thickness of about 2 μm. The n-side interconnect electrode 4 and the p-side interconnect electrode 5 are, for example, aluminum films formed by sputtering with a thickness of about 1 μm. These aluminum films are formed on the entire surface of the dielectric film 9 and then are patterned into the desired electrode configuration by removing the unnecessary portions by wet etching.

Figure 3C:
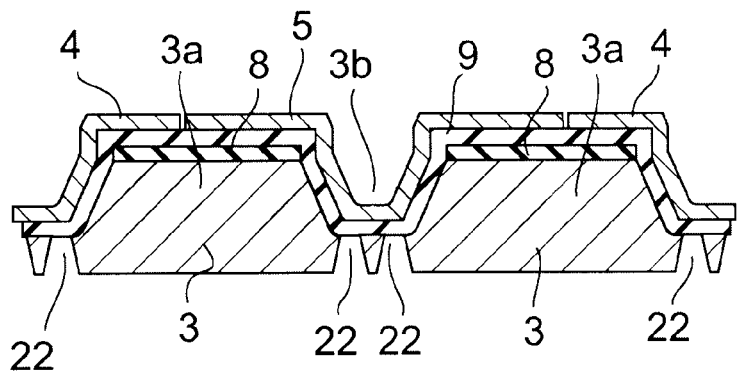
Figure 3D:
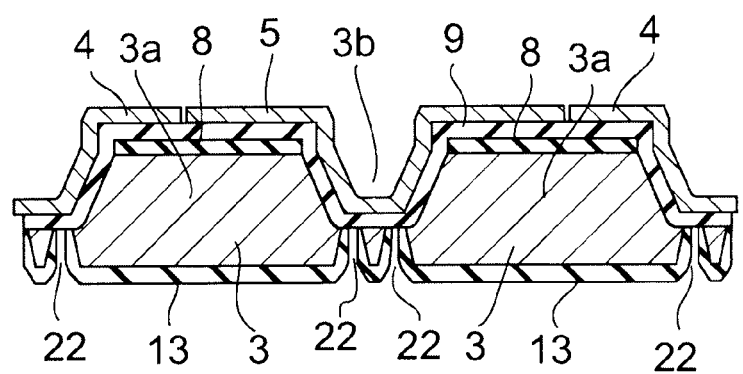

Continuing, the entire surface of the second major surface (the bottom face) of the substrate 3 on the side opposite to the face where the semiconductor light emitting element is mounted is then grinded to make the substrate 3 thin. Then, as illustrated in FIG. 3C, a connection hole 22 is made in the second major surface by, for example, RIE (Reactive Ion Etching). The connection hole 22 is made in the portion below the recess 3b from the second major surface to reach the dielectric film 9.

Figure 4A:
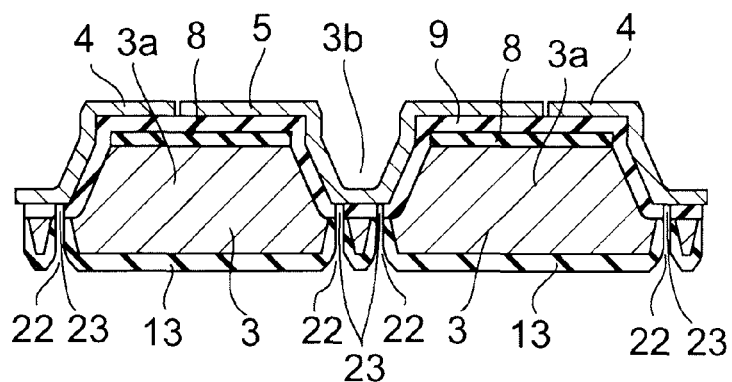

Then, for example, a photosensitive polyimide film is coated on the second major surface and into the connection hole 22. Then, an opening (FIG. 3D) is made in a portion of the polyimide film contacting the dielectric film 9. A connection hole 23 is made in the dielectric film 9 exposed at the opening as illustrated in FIG. 4A. The connection hole 23 passes through the dielectric film 9 formed on the bottom face of the recess 3b to reach the n-side interconnect electrode 4 and the p-side interconnect electrode 5.

Figure 4B:
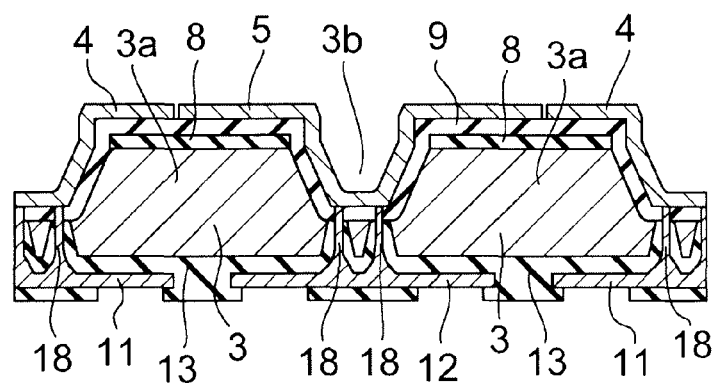

Continuing as illustrated in FIG. 4B, the through-electrodes 18 are filled into the connection holes 22 and 23 and simultaneously the n-side bottom face bonding electrode 11 and the p-side bottom face bonding electrode 12 are formed on the second major surface. These electrodes are made of, for example, copper material formed by plating. Thereby, the n-side interconnect electrode 4 on the first major surface is connected to the n-side bottom face bonding electrode 11 on the second major surface via the through-electrode 18; and the p-side interconnect electrode 5 on the first major surface is connected to the p-side bottom face bonding electrode 12 on the second major surface via the through-electrode 18.

Figure 4C:
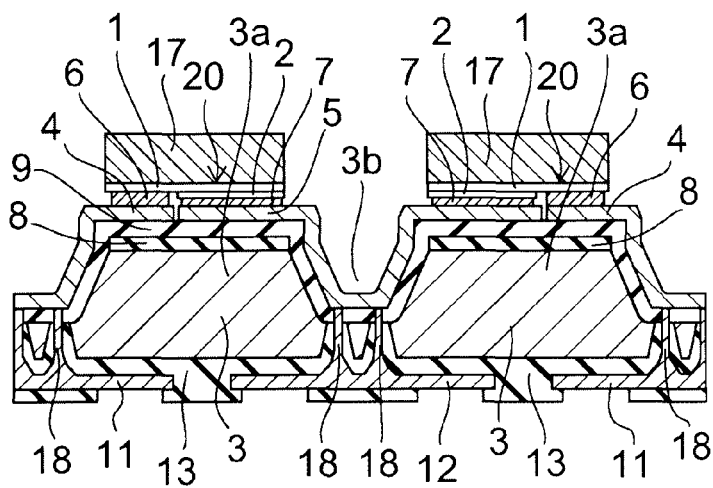

Then, as illustrated in FIG. 4C, the n-side bonding metal 6 and the p-side bonding metal 7 are formed on the n-side interconnect electrode 4 and the p-side interconnect electrode 5, respectively, on the protrusion 3a. Then, the semiconductor light emitting element 20 having a chip configuration is bonded by flip chip bonding to the n-side bonding metal 6 and the p-side bonding metal 7. This bond is performed by, for example, forming Au on the n-side bonding metal 6 and the p-side bonding metal 7 side and Sn on the semiconductor light emitting element 20 side beforehand, performing positional alignment therebetween, and forming eutectic AuSn by thermal fusion. Alternatively, AuSn eutectic solder may be formed by plating beforehand on either the n-side bonding metal 6 and the p-side bonding metal 7 side or the semiconductor light emitting element 20 side. Or, another solder material other than eutectic solder may be used. A metal powder resin mixture such as Ag paste also may be used.

The semiconductor light emitting element 20 is formed on a light emitting element substrate 17 by epitaxial growth and the like separately from the process described above for the substrate 3. To enable easier handling during mounting, the light emitting element 20 is mounted for each of the relatively thick light emitting element substrates 17.

Although the light emitting element substrates 17 are mounted in a separated state for each of the light emitting element 20 in FIG. 4C, the light emitting element substrate 17 may be formed without separating, and multiple light emitting element 20 may be formed as island-like shapes on the light emitting element substrate 17.

After the mounting, because the light emitting element substrate 17 is positioned on the light extraction surface side, a process of removing the light emitting element substrate 17 is performed (FIG. 5A) to reduce the chip thickness to the minimum necessary thickness to reduce the light absorption of the light emitting element substrate 17 and to allow the formation of the reinforcing film 15 and the fluorescent material 10 via the gap 30 described above in a process described below. The light emitting element substrate 17 may be removed by, for example, polishing, etching, lift off by a spacer, laser lift off, and the like. After removing the light emitting element substrate 17, the thickness of the remaining semiconductor light emitting device 20 is about 5 to 10 μm.

After removing the light emitting element substrate 17, the AR coating 40 described above is formed on the entire surface of the wafer. Then, the AR coating 40 on portions of the semiconductor light emitting element 20 other than the light extraction surface is removed. The AR coating 40 is, for example, a $SiO_2$ film formed by plasma CVD (Chemical Vapor Deposition) at 250° C. with a thickness of about 65 nm. The semiconductor light emitting element 20 is bonded by, for example, AuSn solder at this time and therefore can be prevented from shifting due to melting of the solder.

Figure 5A:
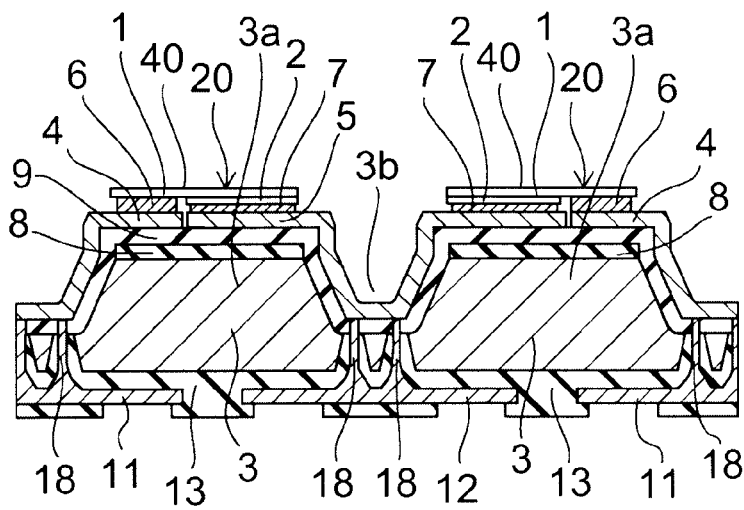
Figure 5B:
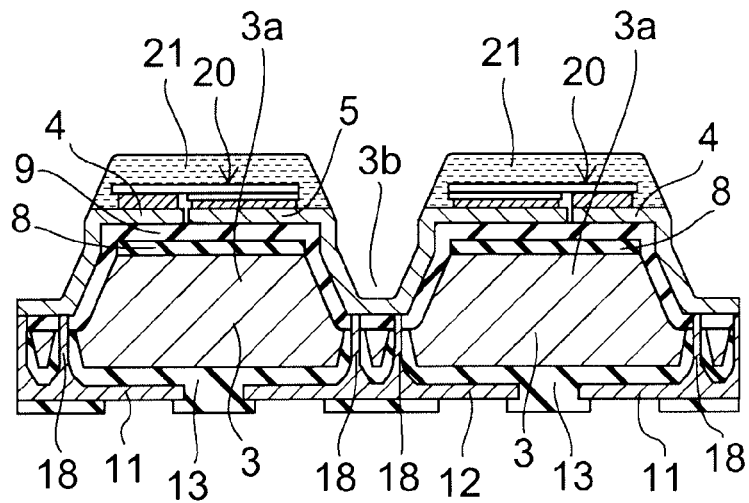

Continuing as illustrated in FIG. 5B, a sacrificial layer 21 is selectively formed on the protrusion 3a of the substrate 3 to cover the semiconductor light emitting element 20. Organic materials are suitable as the material of the sacrificial layer 21; and polyimide, for example, may be used.

The thickness of the sacrificial layer 21 from the top face of the semiconductor light emitting element 20 (the n-type semiconductor 1) is about 3 to 5 μm considering the height of the gap 30 made subsequently. The sacrificial layer 21 is formed on the entire surface of the wafer. Then, patterning is performed to remove the unnecessary portions of the sacrificial layer 21 by dry etching by plasma processing, an alkaline developer, etc., to leave only the portion to define the gap 30.

Figure 5C:
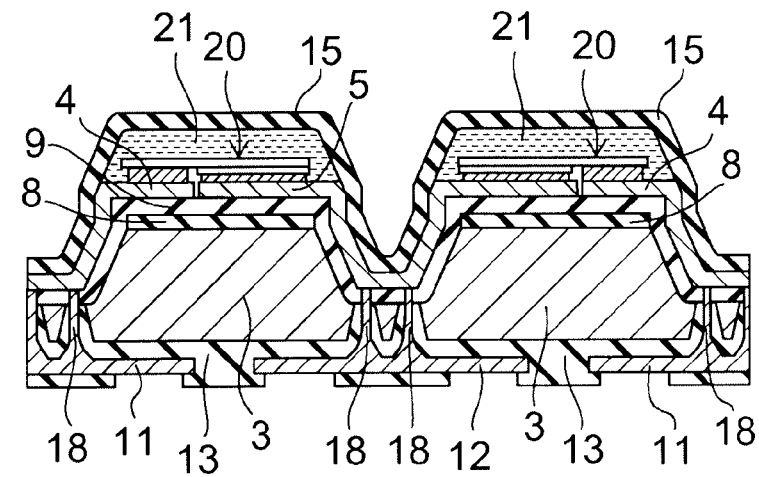

Then, as illustrated in FIG. 5C, the reinforcing film (e.g., the silicon oxide film) 15 is formed to cover the sacrificial layer 21, the n-side interconnect electrode 4, and the p-side interconnect electrode 5. An opening is made in a portion of the reinforcing film 15 on the sacrificial layer 21 for removing the sacrificial layer 21. The opening may be multiply made, for example, in a lattice configuration with diameters of 2 μm at 10 μm pitches by photolithography and dry etching.

The sacrificial layer 21 is removed from above the semiconductor light emitting element 20 through the openings. For example, the sacrificial layer 21 made of polyimide can be removed by ashing by $O_2$ plasma. To reduce the ashing time, the gas introduced into the chamber may include a mixture of several percent of $CF_4$ added to $O_2$ or a forming gas (a gas mixture in which $H_2$ is diluted by $N_2$ to be not more than 3%) mixed with $O_2$. However, it is desirable to make sure the mixing ratio of the $CF_4$ gas is not so high that a near-dry etching state occurs. In other words, it is desirable to keep the flow rate ratio of F to the main $O_2$ gas not more than 3% because the characteristics of the n-side interconnect electrode 4 and the p-side interconnect electrode 5 deteriorate when F bonds with the Al forming the n-side interconnect electrode 4 and the p-side interconnect electrode 5.

Figure 6A:
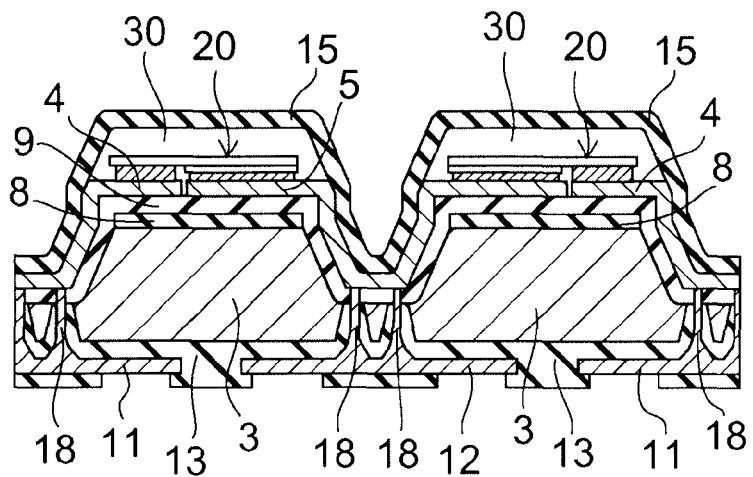

FIG. 6A illustrates the state after removing the sacrificial layer 21. Removing the sacrificial layer 21 leaves the gap 30 enclosed by the reinforcing film 15 around and above the semiconductor light emitting element 20.

The openings made to remove the sacrificial layer 21 may be plugged by, for example, forming a silicon oxide film by CVD. The openings are plugged by depositing the silicon oxide film to overhang from the edges of the openings.

Although the fluorescent material is formed subsequently, normally, the fluorescent material is formed by dispersing a fine powder in a matrix resin to form a paste configuration; using screen printing; and then subsequently performing curing by a method such as heat treatment, ultraviolet curing, and the like. Various resins such as acrylic, polyester, silicone, epoxy, and polyimide may be used as the matrix resin. However, the use of a resin shortens the life of the semiconductor light emitting element itself because the life of the product is determined by the resin.

However, to form a fluorescent material having the desired fluorescent light emission without using a resin, it is necessary to perform heat treatment at a high temperature of about 450° C. Therefore, it is unfavorable from the aspect of device characteristic deterioration for the fluorescent material to cover the semiconductor light emitting element 20 in direct contact.

Therefore, the fluorescent material 10 of this embodiment is formed by the following method.

Figure 6B:
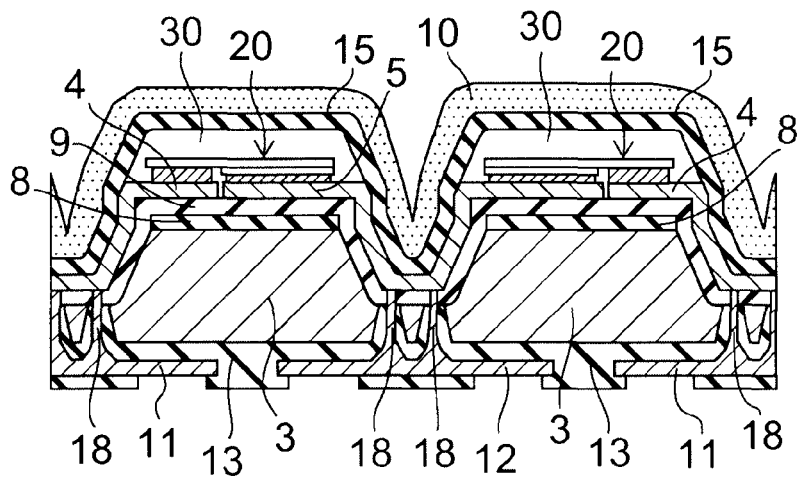

For example, the fluorescent material 10 is formed on the reinforcing film 15 as illustrated in FIG. 6B by sputtering multiple targets of Ba, Mn, Al, Eu, Sr, Ca, Ba, Mg, P, and C in an $Ar/O_2$ gas mixture atmosphere. Then, it is necessary to heat the fluorescent material 10 to obtain the desired fluorescent light emission characteristics. However, it is necessary to prevent the deterioration of the semiconductor light emitting element 20 characteristics caused by the heating at this time.

Figure 6C:
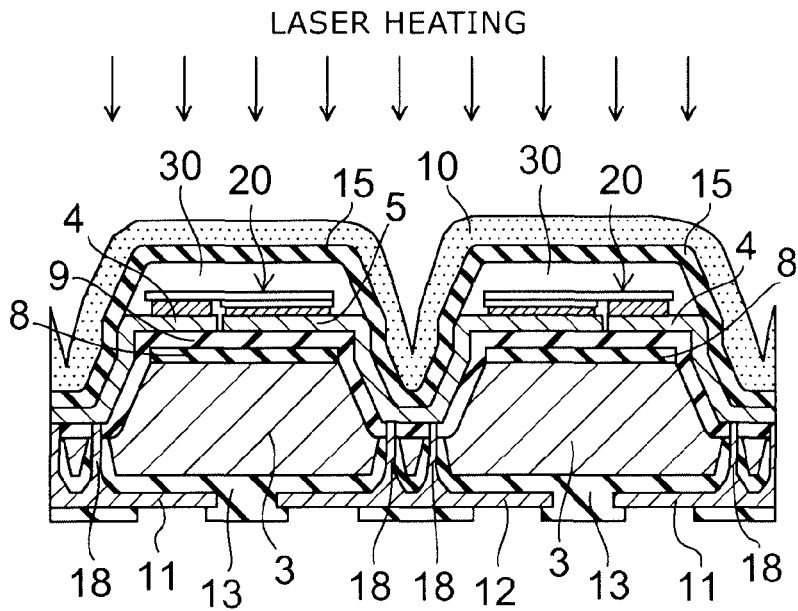

Therefore, in this embodiment as illustrated in FIG. 6C, only the fluorescent material 10 is locally heated from the top face (the face on the side opposite to the face contacting the reinforcing film 15) side of the fluorescent material 10 by laser irradiation; the fluorescent material 10 is reformed to change the characteristics thereof (crystallinity, dimensions, surface morphology, etc.); and the desired fluorescent light emission is obtained.

At this time, the heat of the fluorescent material 10 is not easily conducted to the semiconductor light emitting element 20 due to the gap 30 between the fluorescent material 10 and the semiconductor light emitting element 20. Further, the laser irradiation is from the fluorescent material 10 top face side and does not heat the entire wafer. Therefore, the temperature increase of the substrate 3 can be suppressed, and the temperature increase of the semiconductor light emitting element 20 mounted on the substrate 3 due to heat conducted from the substrate 3 to the semiconductor light emitting element 20 also is prevented. Thus, the temperature increase and characteristic deterioration of the semiconductor light emitting element 20 are suppressed when heating the fluorescent material 10.

The fluorescent material 10 does not directly define the gap 30 and is stabilized and maintained above the gap 30 by the reinforcing film 15. The reinforcing film 15 is, for example, a silicon oxide film and does not melt at the temperature (about 450 to 500° C.) during the laser heating of the fluorescent material 10. Accordingly, the gap 30 can be stabilized and maintained even in the case where the fluorescent material 10 is in a fluidic state due to the laser heating.

It is necessary for the openings made in the film covering the sacrificial layer 21 for removing the sacrificial layer 21 to be fine considering the plugging of the openings after removing the sacrificial layer 21. Here, in the case where the fluorescent material is directly formed on the sacrificial layer 21 without forming the reinforcing film 15 after the process described above in regard to FIG. 5B, it is necessary to make fine openings in the fluorescent material for removing the sacrificial layer 21. However, generally, it is difficult to make fine openings in the fluorescent material. Conversely, fine openings can be made easily in the reinforcing film 15 formed of, for example, a silicon oxide film.

After laser annealing of the fluorescent material 10, the lens 16 illustrated in FIG. 1 is formed on the fluorescent material 10. For example, methyl siloxane is coated onto the fluorescent material 10 by spin coating; a template is brought into contact with the coating film; and a recessed configuration is patterned.

Thereafter, the external connection terminals 14 are formed, dicing and the like is performed to separate the desired pieces from the wafer form, and the structure illustrated in FIG. 1 is obtained.

The processes of forming the components up to dicing described above can be performed collectively in the wafer form, enabling low-cost manufacturing.

The connection hole communicating from the first major surface to the second major surface of the substrate can be made from the first major surface side or from the second major surface side.

Hereinabove, exemplary embodiments of the invention are described with reference to specific examples. However, the invention is not limited thereto, and various modifications are possible based on the technical spirit of the invention. In other words, materials, dimensions, and process conditions other than those illustrated in the exemplary embodiments recited above are implementable without departing from the purport of the invention.

The invention claimed is:

1. A semiconductor light emitting device, comprising:
  a substrate including a first major surface and a second major surface, the first major surface including a recess and a protrusion, the second major surface being formed on a side opposite to the first major surface;
  a first electrode provided on the first major surface;
  a semiconductor light emitting element provided on the first electrode and electrically connected to the first electrode;
  a second electrode provided on the second major surface;
  a through-electrode provided to pass through the substrate at the recess and electrically connect the first electrode and the second electrode; and
  a dielectric film is disposed between the substrate and the first electrode, and the substrate and the second electrode,
  wherein the semiconductor light emitting element is mounted on the upper surface of the protrusion.

2. The device according to claim 1, further comprising a fluorescent material provided above the first major surface and provided above the semiconductor light emitting element via a gap.

3. The device according to claim 2, wherein a reinforcing film is provided between the gap and the fluorescent material, the reinforcing film being dielectric and transparent to a light emitted by the semiconductor light emitting element.

4. The device according to claim 1, wherein the semiconductor light emitting element is mounted on an upper surface of the protrusion.

5. The device according to claim 1, wherein a surface area of an upper surface of the protrusion of the substrate is larger than a surface area of a bottom surface of the recess of the substrate.

6. The device according to claim 1, wherein an anti-reflection coating is provided on a surface of the semiconductor light emitting element.

7. The device according to claim 1, wherein the first electrode is provided also on a side surface of the protrusion and connected to the through-electrode.

* * * * *